United States Patent [19]
Fujiwara

[11] Patent Number: 5,946,253
[45] Date of Patent: Aug. 31, 1999

[54] SEMICONDUCTOR MEMORY DEVICE

[75] Inventor: Keisuke Fujiwara, Tokyo, Japan

[73] Assignee: NEC Corporation, Tolyo, Japan

[21] Appl. No.: 08/891,196

[22] Filed: Jul. 10, 1997

[30] Foreign Application Priority Data

Jul. 11, 1996 [JP] Japan ................................. 8-181935

[51] Int. Cl.$^6$ ................................................. G11C 7/02
[52] U.S. Cl. ............... 365/207; 365/189.01; 365/189.04;
365/189.05; 365/196
[58] Field of Search ...................... 365/207, 190,
365/205, 189, 185.21, 189.01, 189.04, 189.05,
230.08, 198, 196

[56] References Cited

U.S. PATENT DOCUMENTS

| 4,511,997 | 4/1985 | Nozaki et al. | 365/189 |
| 5,519,661 | 5/1996 | Miura | 365/205 |

FOREIGN PATENT DOCUMENTS 2-3168 1/1990 Japan .
8-138377 5/1996 Japan .

OTHER PUBLICATIONS

English Translation of Japanese Patent Office Action for Japanese Patent Application 8–181935 dated Dec. 22, 1998.

*Primary Examiner*—David Nelms
*Assistant Examiner*—Thong Le
*Attorney, Agent, or Firm*—Sughrue, Mion, Zinn, Macpeak & Seas, PLLC

[57] ABSTRACT

In a semiconductor memory device in which cell arrays are connected to a shared bus line through sense amplifiers at the time of reading-out and writing operations, a sub-amplifier is provided between two bus lines, the sub-amplifier amplifying a potential difference of reading-out data fetched on the bus lines from the selected sense amplifier and a potential difference of writing data input to the bus lines from the outside. The sub-amplifier has an ability to amplify the potential differences of both of the reading-out data and writing data on the bus lines without separating the bus lines, whereby the amount of delay due to wiring can be reduced.

4 Claims, 13 Drawing Sheets

SEMICONDUCTOR MEMORY DEVICE

BACKGROUND OF THE INVENTION

1. Field of the Invention

The present invention relates to a semiconductor memory device, more particularly to a semiconductor memory device which has a read bus line and a write bus line at the time of reading-out and writing operations or a bus line sharing reading-out and writing operations.

2. Description of the Related Art

A semiconductor memory device having a constitution shown in FIG. 1 has been heretofore known as a semiconductor memory device having a read bus line and a write bus line at the time of reading-out and writing operations or a bus line sharing reading-out and writing operations. FIG. 1 shows a constitution of the semiconductor memory device in which components from a memory cell to an I/O circuit are illustrated. The semiconductor memory device of FIG. 1 consists of memory cell arrays 611, 612, ..., and 61$m$, sense amplifiers 621, 622, ..., 62$m$, a write amplifier 63, a data amplifier 64, an I/O circuit 65, and a control circuit 66.

As shown in the circuit diagram of FIG. 2, for example, the control circuit 66 consists of two-input NAND circuits NA91 to NA9$m$ and inverters INV911 to INV91$m$ provided at each output of the NAND circuits NA91 to NA9$m$ respectively. Sense amplifier selection signals Y61 to Y61$m$ output from the inverters INV911 to INV91$m$ are input to the sense amplifiers 621 to 62$m$ as selection signals, respectively. The control circuit 66 controls by using the respective sense amplifier selection signals Y61 to Y6$m$ so that only the sense amplifier connected to the memory cell array having a cell (objective cell) performing data reading-out or writing operations operates.

Next, the reading-out operation of this conventional semiconductor memory device will be described with reference to the timing chart of FIG. 3.

For example, in a case where an objective cell is present in the cell array 611 of FIG. 1, at the time of data reading-out operation, only data YAD1 decoded from an address signal is made high in level immediately before a column address strobe (CAS) signal input to the control circuit 66 is made high in level as shown in FIG. 3. Data YAD2 to YAD$m$ decoded from other address signals remain low in level. For this reason, the sense amplifier selection signal Y61 output from the inverter INV911 is made high in level and the sense amplifier selection signals Y62 to Y6$m$ output from other inverters INV912 to INV91$m$ are made low in level, whereby only the sense amplifier 621 shown in FIG. 1 operates.

Thus, read-out data DT1 and DN1 of cell array 611 having an objective cell are amplified by the sense amplifier 621 and levels on the bus lines DB and XDB are changed as shown in FIG. 3. And, then data DT1 and DN1 are input to a data amplifier 64. Thereafter, they are output via the I/O circuit 65.

Next, an operation at the time of data writing will be described with reference to the timing chart of FIG. 4.

For example, in case where an objective cell is present in the cell array 611 of FIG. 1, at the time of data writing, after the input data is input to a write amplifier 63 via the I/O circuit 65 and it is amplified, the input data appears on the bus lines DB and XDB as shown in FIG. 4. Moreover, immediately before the CAS signal is made high in level as shown in FIG. 4, only the data YAD1 decoded from the address signal is made high in level, and the data YAD2 to YAD$m$ decoded from other address signals remain low in level. Therefore, as shown in FIG. 4, the sense amplifier selection signal YG1 output from the inverter INV911 is made high in level and the sense amplifier selection signals Y62 to Y6$m$ are made low in level, and only the sense amplifier 621 shown in FIG. 1 operates. Thus, data DT1 and DN1 amplified by the sense amplifier 621 shown in FIG. 1 are written to the objective cell in the cell array 611.

FIG. 5 shows simulation results at the time of data writing operation in the conventional semiconductor device. The simulation results show the case where when data DT1 is high in level and data DN1 is low in level, data is output from the sense amplifier 621 whereby the data DT1 is made low in level and the data DN1 is made high in level. From FIG. 5, it can be seen that a time of 5.4 ns is required from the time of making sense amplifier selection signal Y61 high in level until lines of data DT1 and DN1 crosses.

However, in the conventional semiconductor memory device shown in FIG. 1, at the time of reading-out and writing operations, I/O data of m sense amplifiers 621 to 62$m$ share a read bus line and a write bus line, or a bus line sharing one read-out and write-out. When the number of divisions of memory cells increases due to an increase in storage capacitance, wiring lengths of the bus lines DB and XDB increase so that the amount of data delay due to the wiring becomes larger. Particularly, when the semiconductor memory device is the dynamic random access memory according to the Rambus channel (Rambus DRAM) manufactured by Rambus corporation, which is able to transmit the data between microprocessor by a high speed of 500 Mbps, input and output of data must be on one side of a chip by reason of the package. Therefore, the amount of delay on the bus lines DB and XDB increases.

Furthermore, in order to cope with micronization of design rules and in order to save manufacturing cost, tungsten is sometimes used as wiring materials instead of aluminum. In this case, wiring resistance increases. In such circumstances, in the conventional semiconductor memory device shown in FIG. 1, the amount of delay due to the wiring further increases, whereby transmitting speeds of signals between the sense amplifiers 621 to 62$m$ and the write amplifier 63 and the sense amplifiers 621 to 62$m$ and the data amplifier 64 are decreased.

To solve such problems, a semiconductor memory device having an auxiliary sense amplifier on the read bus line is recited in Japanese Patent Application Laid Open No. 2-3168. FIG. 6 is a block diagram of an example of the semiconductor memory device recited in this gazette, which shows the constitution including the components from memory cells to output circuit. This semiconductor memory device consists of memory cell arrays 811, 812, ..., and 81$m$, first sense amplifiers 821, 822, ..., and 82$m$, a second sense amplifier 83, an output circuit 84, and a buffer amplifier 85. In the semiconductor memory device, a control operation is conducted, using sense amplifier selection signals Y81, Y82, ..., and Y8$m$, such that only the first sense amplifier connected to a memory cell array in which an objective cell is present operates.

FIG. 7 shows a circuit diagram of an example of the buffer amplifier 85 in FIG. 6. As shown in FIG. 7, the buffer amplifier 85 consists of NMOS transistors Q91 and Q92 which operate upon receiving level changes of signal lines RB1 and XRB1 on their gates and an NMOS transistor Q93 receiving an enable signal BE on its gate to put buffer amplifier 85 into an operative state. The bus lines are divided into RB1 and XRB1, RB2 and XRB2 via the buffer amplifier 85.

Next, an operation of the conventional semiconductor memory device will be described. First, when an objective cell is present in the cell array 811, the first sense amplifier selection signal Y81 is made high in level, whereby the first sense amplifier 821 arranged corresponding to the cell array 811 operates. At this time, the enable signal BE of the buffer amplifier 85 is also made high in level so that the buffer amplifier 85 is put into an operative state.

Thus, after data of the cell array 811 having the objective cell is amplified by the first sense amplifier 821, the data appears as a potential difference on the bus lines RB1 and XRB1, and the potential difference is amplified by the buffer amplifier 85. The amplified data from the buffer amplifier 85 is supplied to the second sense amplifier 83 via the bus lines RB2 and XRB2 and is amplified further. Then, the data is output through the output circuit 84.

Next, when the objective cell is present in the cell array 81*m*, the first sense amplifier selection signal Y8*m* is made high in level by detecting the change in the address signal, and the first sense amplifier 82*m* arranged corresponding to the cell array 81*m* operates. At this time, the enable signal BE for the buffer amplifier 85 is low in level, so that the buffer amplifier 85 is put into the disable state.

Thus, data of the cell array 81*m* having the objective cell is amplified by the first sense amplifier 82*m*, and the amplified data is output on the bus lines RB2 and XRB2 as a potential difference. Next, the potential difference is amplified by the second sense amplifier 83, and the amplified potential difference is output through the output circuit 84. In this semiconductor memory device, the buffer amplifier 85 is arranged at an intermediate position on the shared read bus line, and the read bus line is divided into two parts. When the objective cell is present in the cell arrays from 81*j* to 81*m*, capacitance of the bus line can be made smaller compared to the case where the buffer amplifier 85 is not provided. Therefore, transmission speed of signals will be high.

In the conventional semiconductor memory device shown in FIG. 6, since the bus lines are separated by the buffer amplifier 85, wiring capacitance at the time of operations can be made small. However, timings of the sense amplifier selection signals Y81 to Y8*m* must be adjusted for the portion where the bus lines are separated. Furthermore, since the buffer amplifier 85 is provided, the bus lines can not be used both for reading-out and writing operations, so that the bus lines can not be used for shared bus lines.

SUMMARY OF THE INVENTION

The present invention is devised in view of the above problems, and the purpose of the invention is to provide a semiconductor memory capable of a quick operation by reducing the amount of delay due to a wiring, while using a common bus for reading and writing in the bus lines connected with a plurality of sense-amplifiers.

In order to attain the above the purpose, a semiconductor memory of the invention comprises a plurality of memory cell arrays; a plurality of sense amplifiers, each being arranged for corresponding to one of said memory cell arrays and for amplifying an input from the corresponding one of said cell arrays and an output thereto; two bus lines connected to said sense amplifiers, said bus lines transmitting data read out from said cell arrays and data written to said cell arrays as a potential difference; and at least one sub-amplifier connected between said two bus lines, said sub-amplifier amplifying the potential difference of the read-out data output on said two bus lines from a selected one of said sense amplifiers and the potential difference of said written data input to said two bus lines from an external portion.

According to the present invention, a sub-amplifier is provided between the two bus lines for amplifying the differential potential of the two bus lines used in common for reading and writing without separating the bus lines. This enables both of the reading data and writing data on the bus lines to be amplified while the common bus lines are used for reading and writing, thereby reducing the amount of delay caused by the wiring.

According to this present invention, the sub-amplifier comprises a first transistor a gate of which is connected with one of the bus lines, and the drain is connected with the other bus line; a second transistor of the same conductivity type with the first transistor, a gate of which is connected with the other bus line, and the drain of which is connected with one of the bus lines; a third transistor of the same conductivity type as those of the first and second transistors, a drain of which is connected in common with the sources of the first and second transistors, the third transistor being controlled by receiving an enable signal through the gate.

According to the present invention, the third transistor is turned on by activating the enable signal so as to put the sub-amplifier into an active state, and the differential potential between the two bus lines is amplified by a differential amplifier composed of the first and the second transistors. This makes the present invention useful when the pre-charge level of the bus a lines is a power-supply voltage.

According to this present invention, the sub-amplifier comprises a first transistor, a gate of which is connected with one of the two bus lines and a drain of which is connected with the other bus line; a second transistor of the same conductivity type as that of the first transistor, a gate of which is connected with the other bus line, and a drain of which is connected with one of the bus lines; a third transistor of the same conductivity type as those of the first and second transistors, a drain of which is connected in common with the sources of the first and second transistors, and the source of which is connected with a power-supply terminal on the lower potential side, the third transistor being controlled by receiving an enable signal through the gate thereof; an inverter for inverting the enable signal; a fourth transistor of a different conductivity type from that of the first transistor, a gate and drain of which are connected with the gate and drain of the first transistor respectively; a fifth transistor of the same conductivity type as that of the fourth transistor, a gate and a drain of which are connected with the gate and drain of the second transistor respectively; and a sixth transistor of the same conductivity type as those of the fourth and fifth transistors, a source of which is connected in common with the sources of the fourth and fifth transistors, and a drain of which is connected with the power-supply terminal on the higher potential side, the sixth transistor being controlled by receiving the output signal of the inverter through the gate.

According to the present invention, the third and sixth transistors are turned on by activating the enable signal so as to put the sub-amplifier into an enabled state, and the differential potential between the two bus lines is amplified by the differential amplifier composed of the first and second transistors and the differential amplifier composed of the fourth and fifth transistors. This makes the present invention useful when the pre-charge level of the bus lines is a half of the power-supply voltage.

As described above, according to the present invention, even when the wiring resistance and the wiring capacitance increase because a plurality of sense amplifiers are connected with the bus lines and the wiring of the bus lines are made longer, the amount of delay due to the wiring can be reduced, while the bus lines are used in common for reading and writing, thereby enabling a faster operation.

The above and other objects, features, and advantages of the present invention will become apparent from the following description with references to the accompanying drawings which illustrate preferred embodiments of the present invention.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

Figure 1:
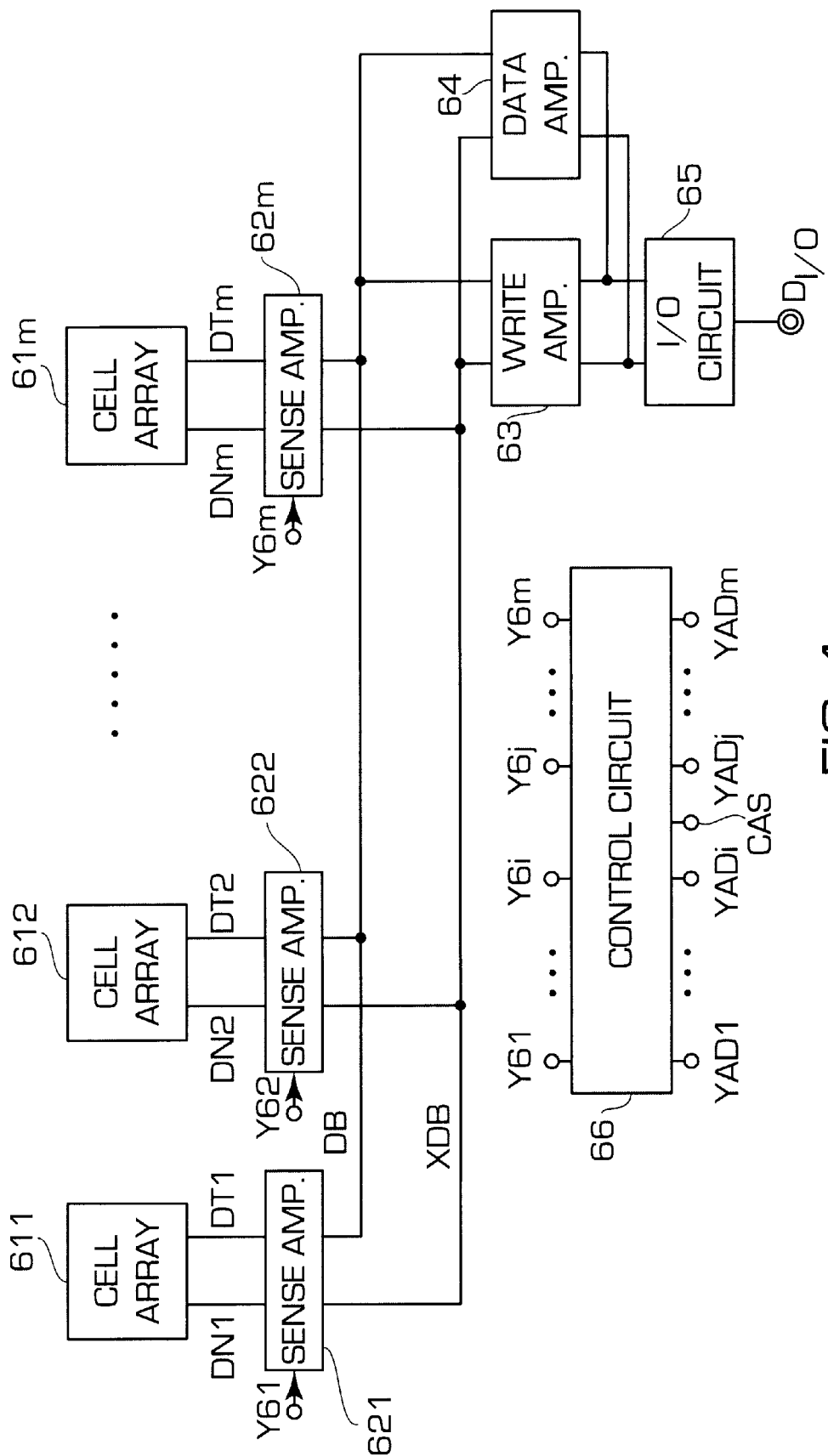
FIG. 1 is a block diagram showing a conventional semiconductor memory device.
Figure 2:
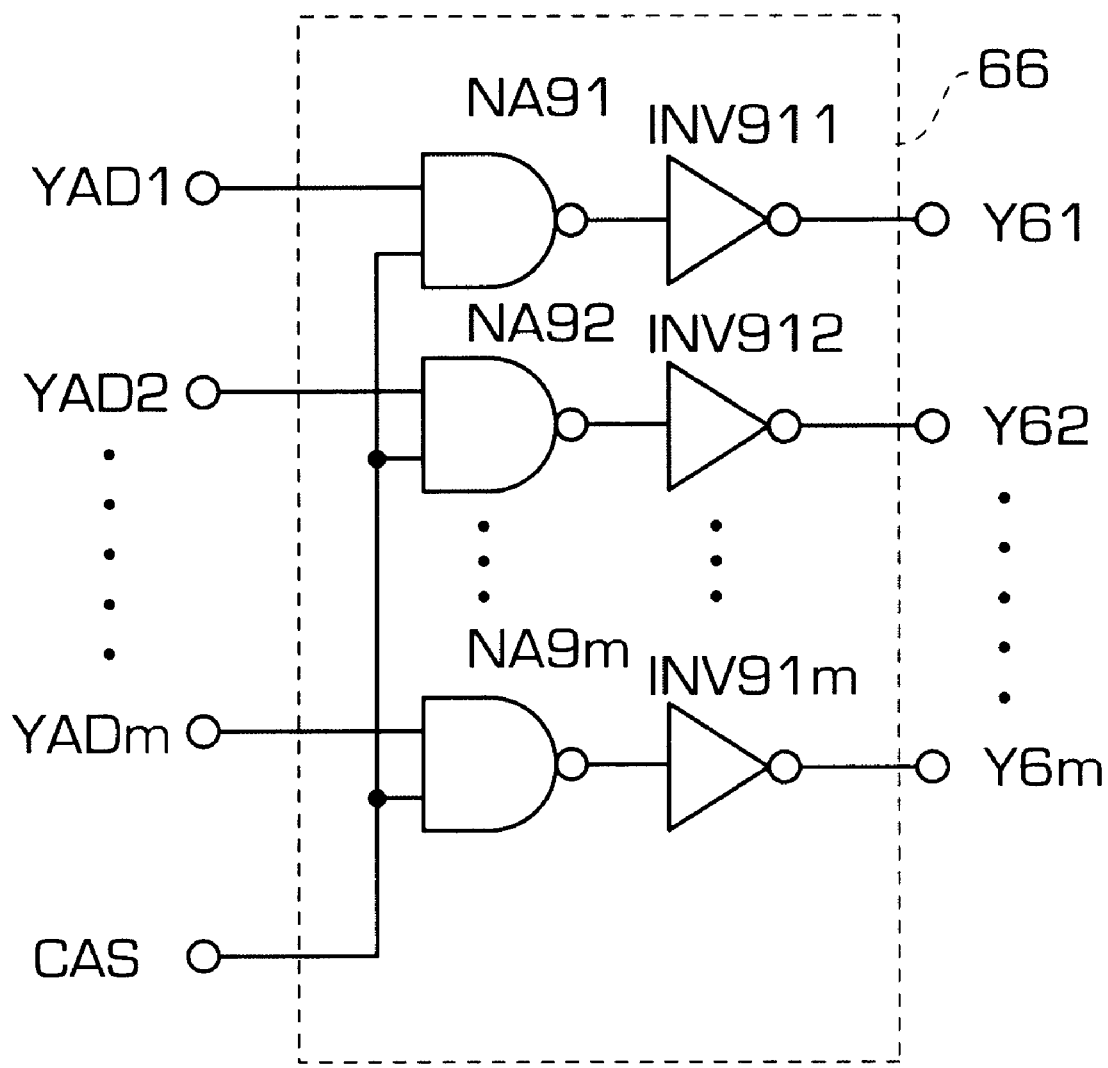
FIG. 2 is a circuit diagram showing a control circuit 66 in FIG. 1.
Figure 3:
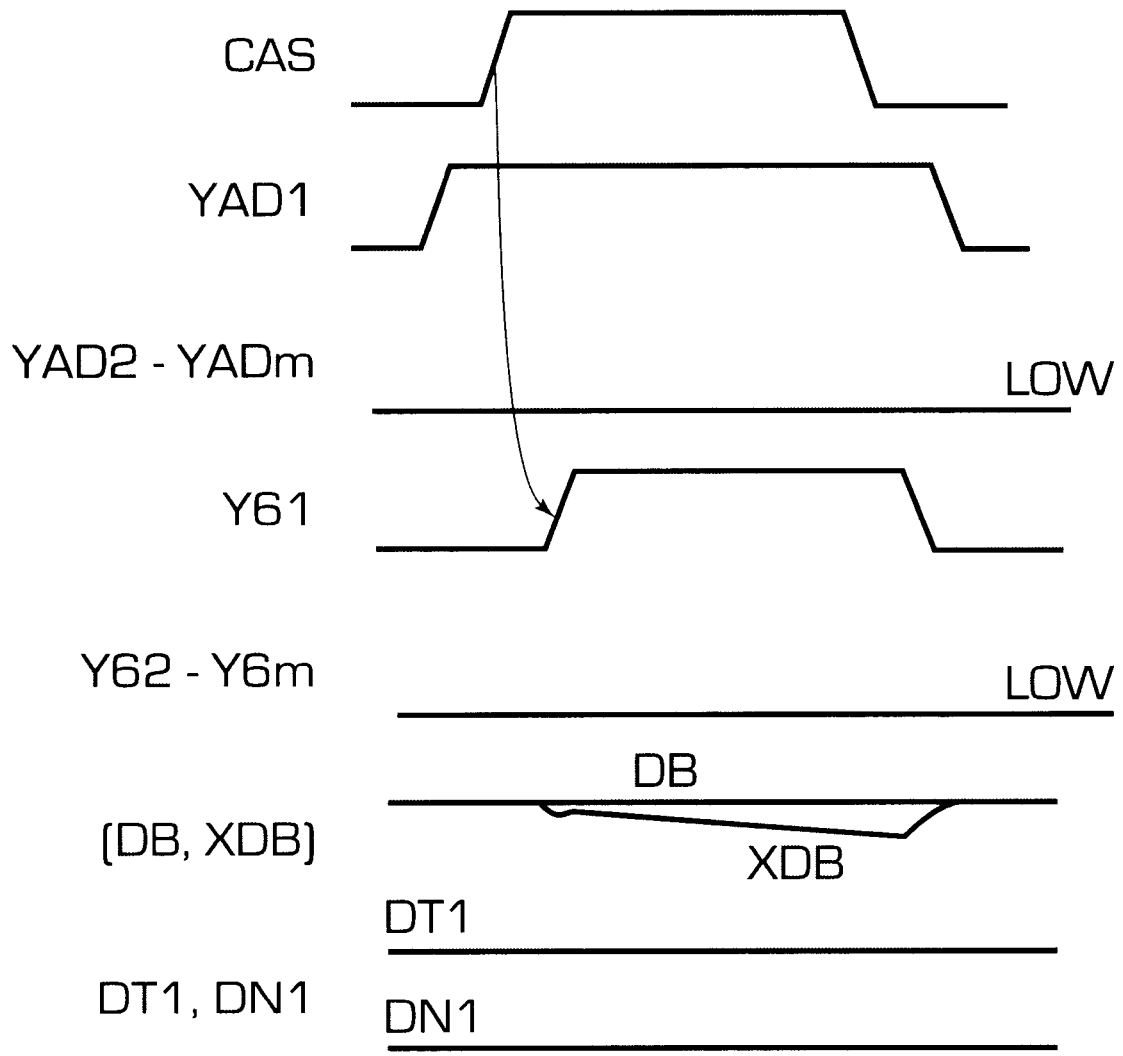
FIG. 3 is a timing chart for explaining an operation at the time of reading shown in FIG. 1.
Figure 4:
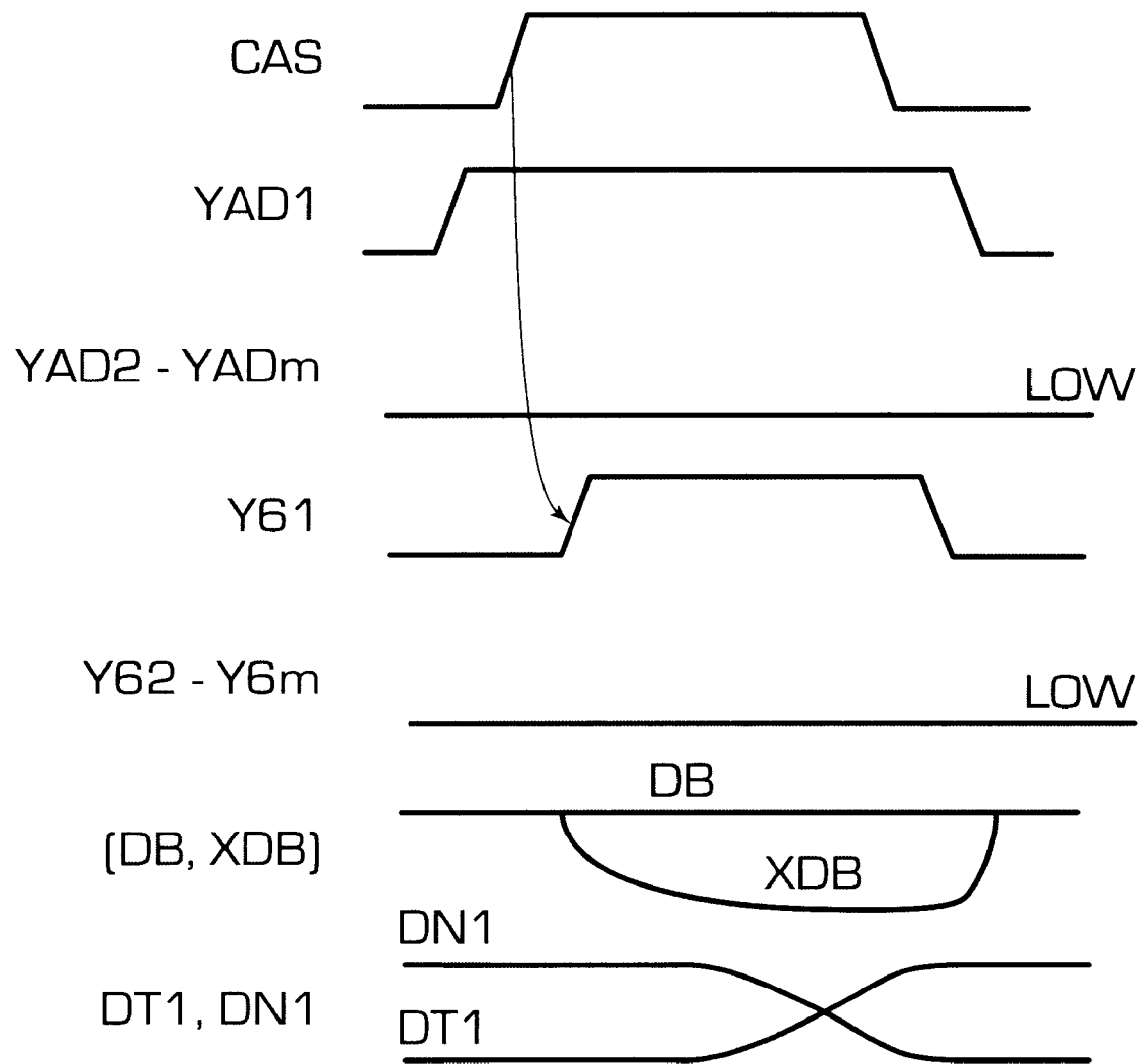
FIG. 4 is a timing chart for explaining an operation at the time of writing shown in FIG. 1.
Figure 8:
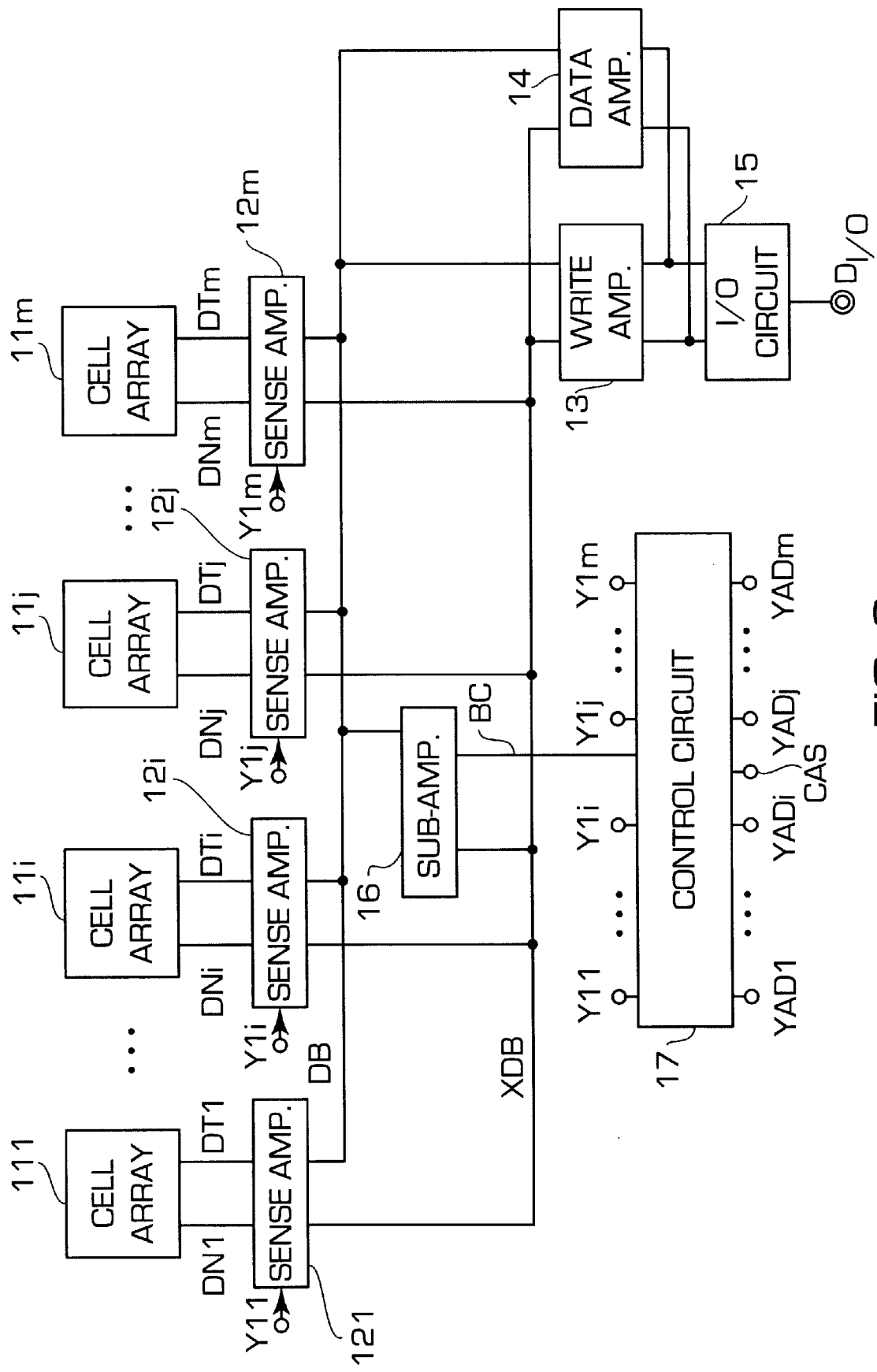
FIG. 8 is a block diagram showing a first embodiment of the present invention.

Next, embodiments of the present invention will be described with reference to the drawings. FIG. 8 is a block diagram showing an embodiment of a semiconductor memory device of the invention. This embodiment is composed of m number of cell arrays 111 through 11$m$; m number of sense amplifiers 121 through 12$m$ provided for the respective cell arrays 111 through 11$m$ with a one-to-one correspondence; a write amplifier 13 for amplifying writing data; a data amplifier 14 for amplifying read-out data; an I/O circuit 15 for inputting and outputting data; and a sub-amplifier 16 of a differential type provided between common bus lines 1)B and XDB for the sense amplifier 121 through 12$m$, the write amplifier 13 and the data amplifier 14. Namely, compared with the conventional semiconductor memory device shown in FIG. 1, the present invention is characterized by having the sub-amplifier 16 of the differential type, provided between the common bus lines DB and XDB.

Figure 9:
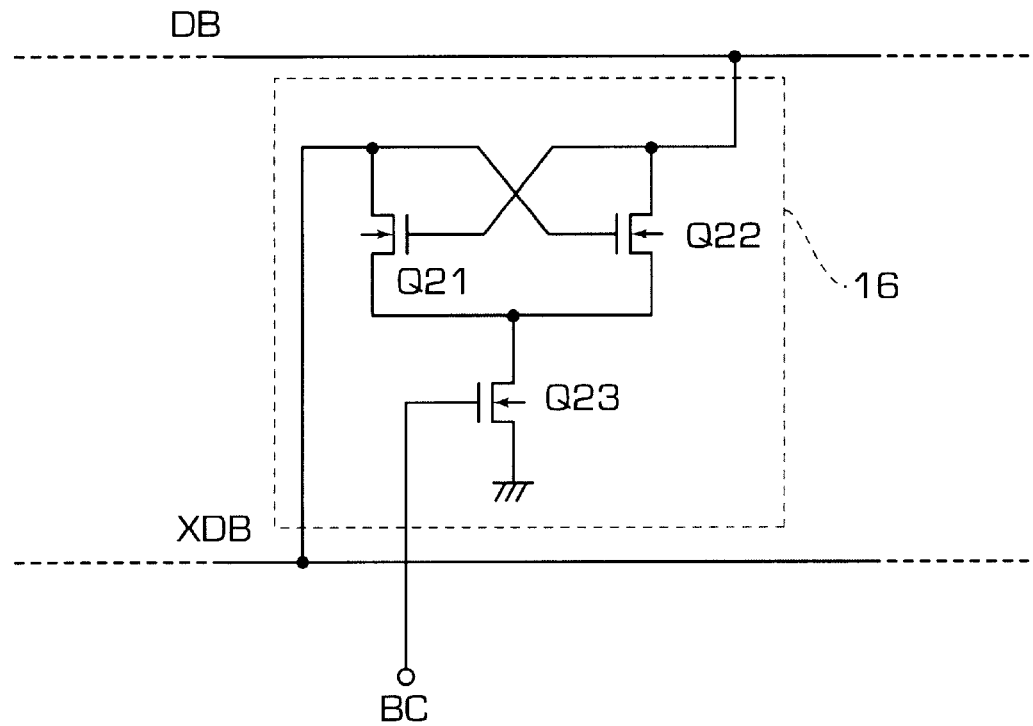
FIG. 9 is a circuit diagram showing an example of a circuit for a sub-amplifier 16 in FIG. 8.

FIG. 9 is a circuit diagram showing an example of the sub-amplifier 16 shown in FIG. 8. This sub-amplifier 16 is composed of first and second NMOS transistors Q21 and Q22 which are operated upon detection of a change in the signal level of the bus lines DB and XDB; and a third NMOS transistor Q23 a drain of which is connected in common with the sources of the NMOS transistors Q21 and Q22, with its source being grounded and the gate being connected with a sub-amplifier enable signal line BC.

Figure 11:
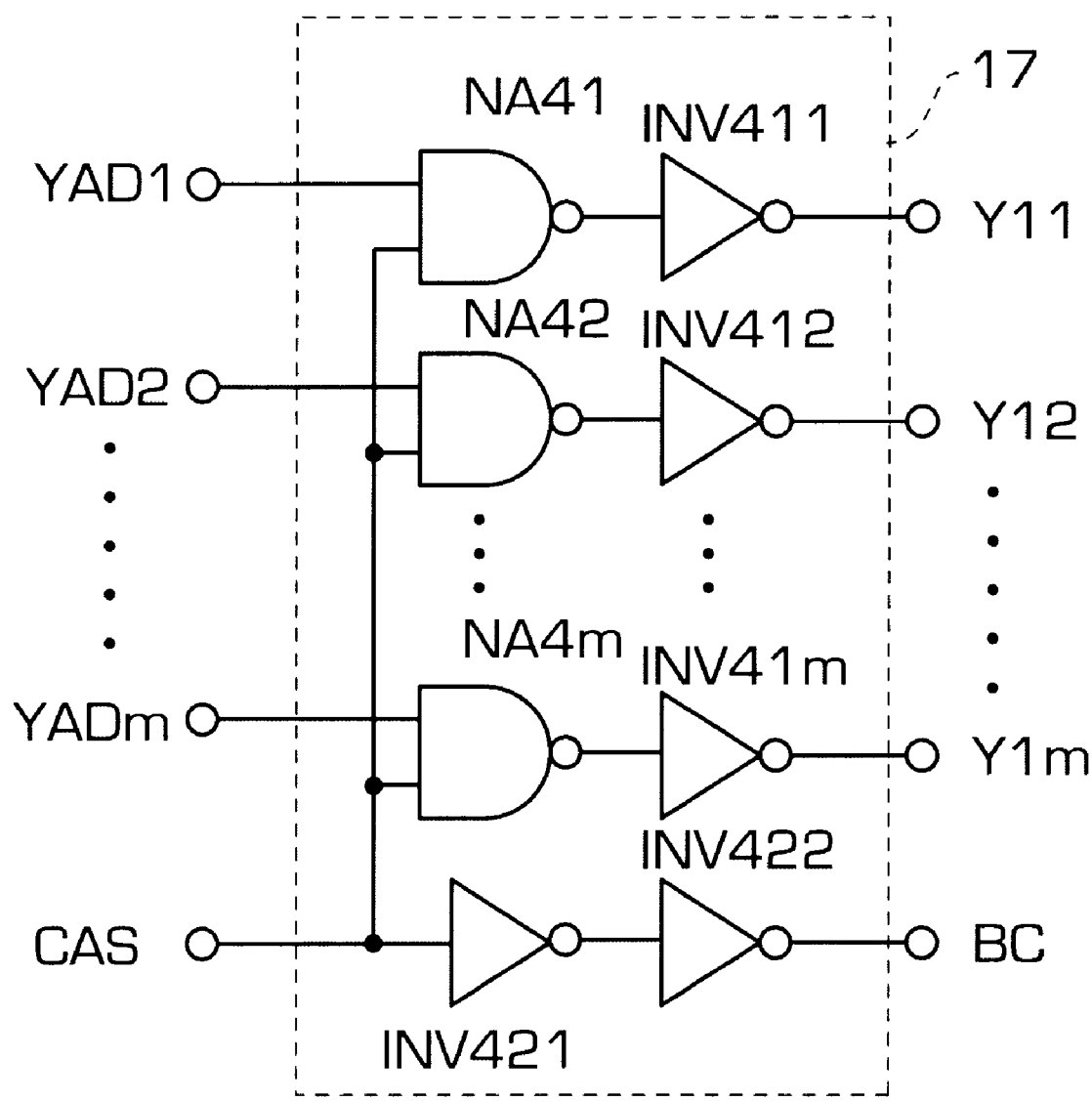
FIG. 11 is a circuit diagram of a control circuit 17 in FIG. 8.

FIG. 11 is a circuit diagram showing an example of the control circuit 17 in FIG. 8. This control circuit 17 is composed of two-input NAND circuits NA41 through NA4$m$, for receiving the CAS signal through one input terminal and receiving data YAD1 through YAD$m$ decoded from the address signal through the other terminal; inverter INV411 through INV41$m$ provided at each output of the NAND circuits NA41 through NA4$m$; and inverters INV421 and INV422 connected in vertical connection for generating a control signal from the CAS signal, which is output on the sub-amplifier enable signal line BC. Each of the output signals Y11 through Y1$m$ of the inverters INV411 through INV41$m$ are input as selection signals into the sense amplifiers 121 thorough 12$m$ in FIG. 8, and performs a control operation so as to drive only a sense amplifier connected with a memory cell array in which an objective cell exists.

Figure 12:
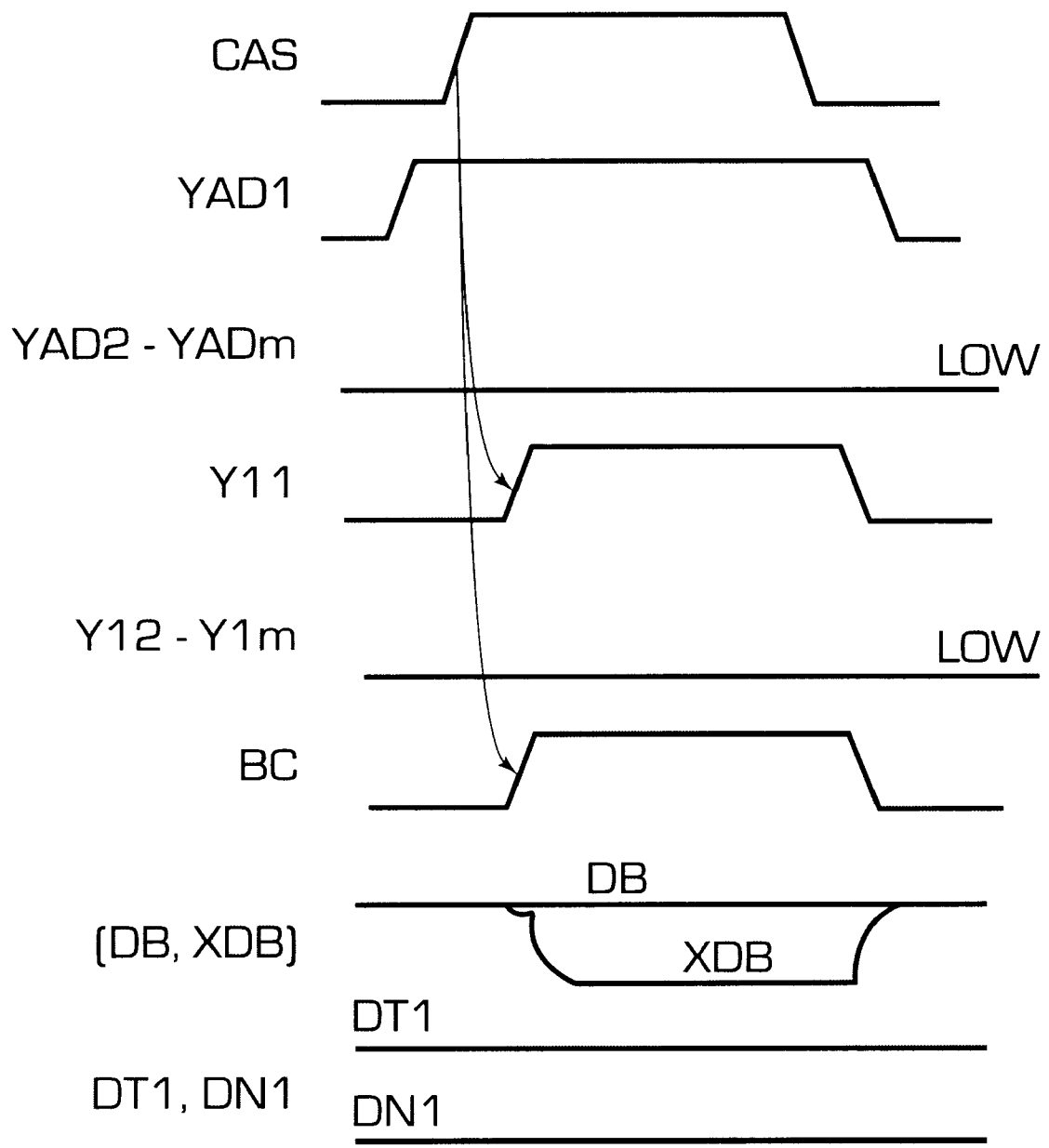
FIG. 12 is a timing chart for explaining an operation at the time of reading shown in FIG. 8.

Now, an operation of the embodiment in FIG. 8 will be described. First, an operation at the time of reading will be described with reference to the timing chart in FIG. 12. Assuming that an objective cell exists in the cell array 111, at the time of reading, only the data YAD1 decoded from the address signal immediately before the CAS signal supplied to the control circuit 17 reaches the high level as shown in FIG. 12, while the data YAD2 through YAD$m$ decoded from the other address signals are at the low level. Consequently, as shown in FIG. 12, the sense amplifier selection signal Y11 of the inverter INV411 reaches the high level, while the sense amplifier selection signal Y12 through Y1$m$ of the other inverters INV412 through 41$m$ are at the low level, so that only the sense amplifier 121 shown in FIG. 8 is operated.

Accordingly, the read-out data DT1 and DN1 from the cell array 111 having the objective cell is amplified by the sense amplifier 121, the bus lines DB and XDB change as shown in FIG. 12. At this stage, an enable signal which reaches the high level synchronized with the sense amplifier selection signal Y1 1 is supplied to the sub-amplifier enable signal line BC as in FIG. 12, thereby placing the sub-amplifier 16 into an active state. As a result, the data on the bus lines DB and XDB, output from the sense amplifier 121, is differential-amplified by the sub-amplifier 16. Then the data differential-amplified by the data 16 is transmitted to the data amplifier 14 through the bus lines DB and XDB, and output via the I/O circuit 15 after being amplified therein.

Next, an operation for writing data will be described with reference to a timing chart in FIG. 13. At the time of writing data, the input data is supplied to the write amplifier 13 through the I/O circuit 15 shown in FIG. 8, and the input data is amplified therein. Afterward, the input data is transmitted to the bus lines DB and XDB. At this time, as shown in FIG. 13, the sub-amplifier 16 is put into an active state, to cause the enable signal on the sub-amplifier enable signal line BC to reach the high level synchronized with the CAS signal, entering the active state, so as to amplify the data on said bus lines DB and XDB.

Figure 13:
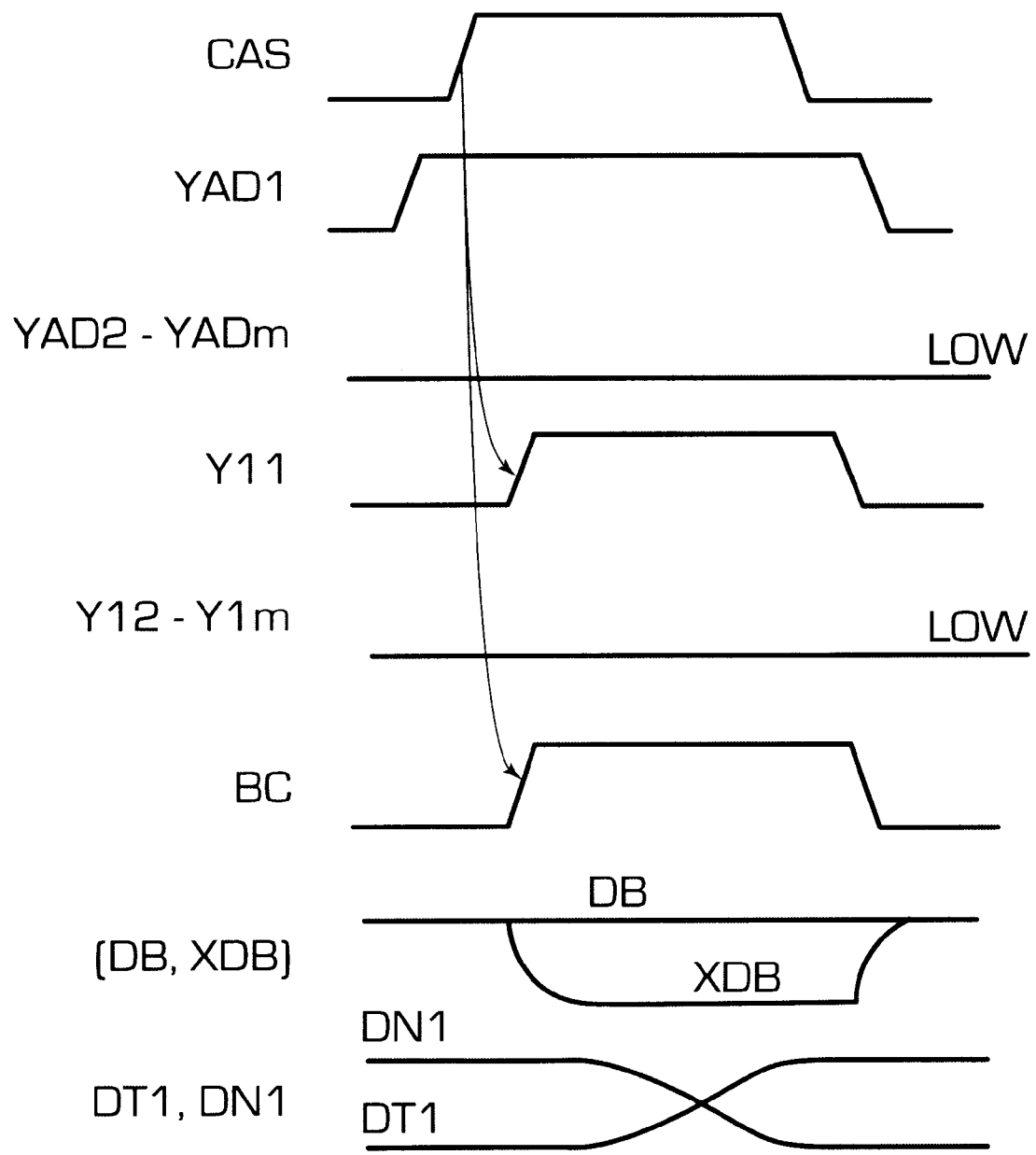
FIG. 13 is a timing chart for explaining an operation at the time of writing shown in FIG. 8.

As shown in FIG. 13, only the data YAD1 which is decoded from the address signal immediately before the CAS signal reaches the high level, while the data YAD2 through YAD$m$ decoded from the other address signal stay at the low level. Therefore, as shown in FIG. 12, the sense amplifier selection signal Y11 of the inverter INV 411 reaches the high level, while the sense amplifier selection signals Y12 through Y1m of the other inverters INV 412 through 41m stay at the low level, so that only the sense amplifier 121 shown in FIG. 8 is operated.

Consequently, the data DT1 and DN1 shown in FIG. 12, which are amplified by the sub-amplifier 16 and further amplified by the sense amplifier 121, are written in the cell array 111 having the objective cell shown in FIG. 8. The present embodiment of the invention, in which the sub-amplifier 16 has such a constitution as shown in FIG. 9, is useful when the pre-charge level of the bus lines DB and XDB is the power-supply voltage VCC.

Figure 5:
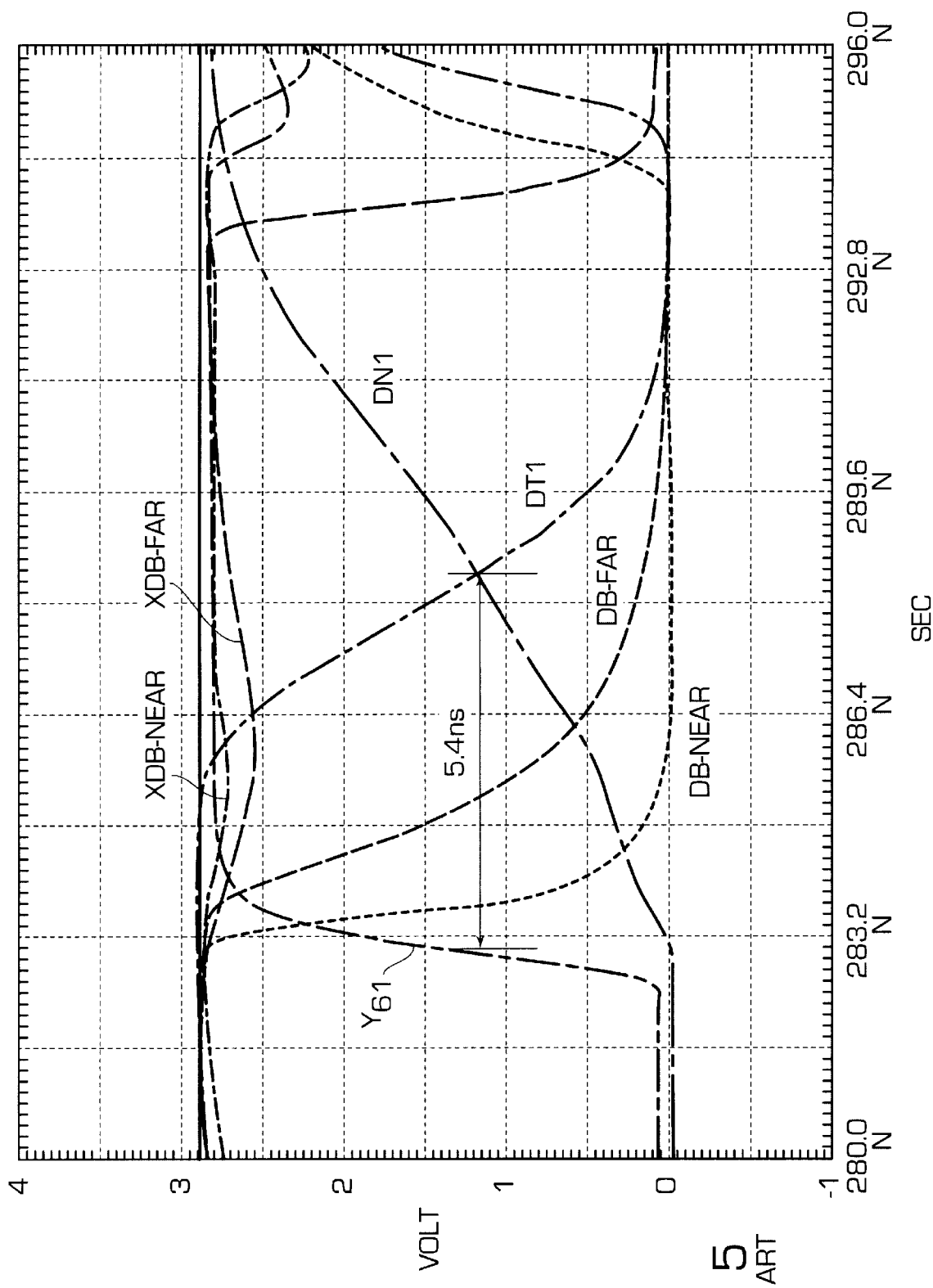
FIG. 5 is a diagram showing the simulation results at the time of writing shown in FIG. 1.
Figure 6:
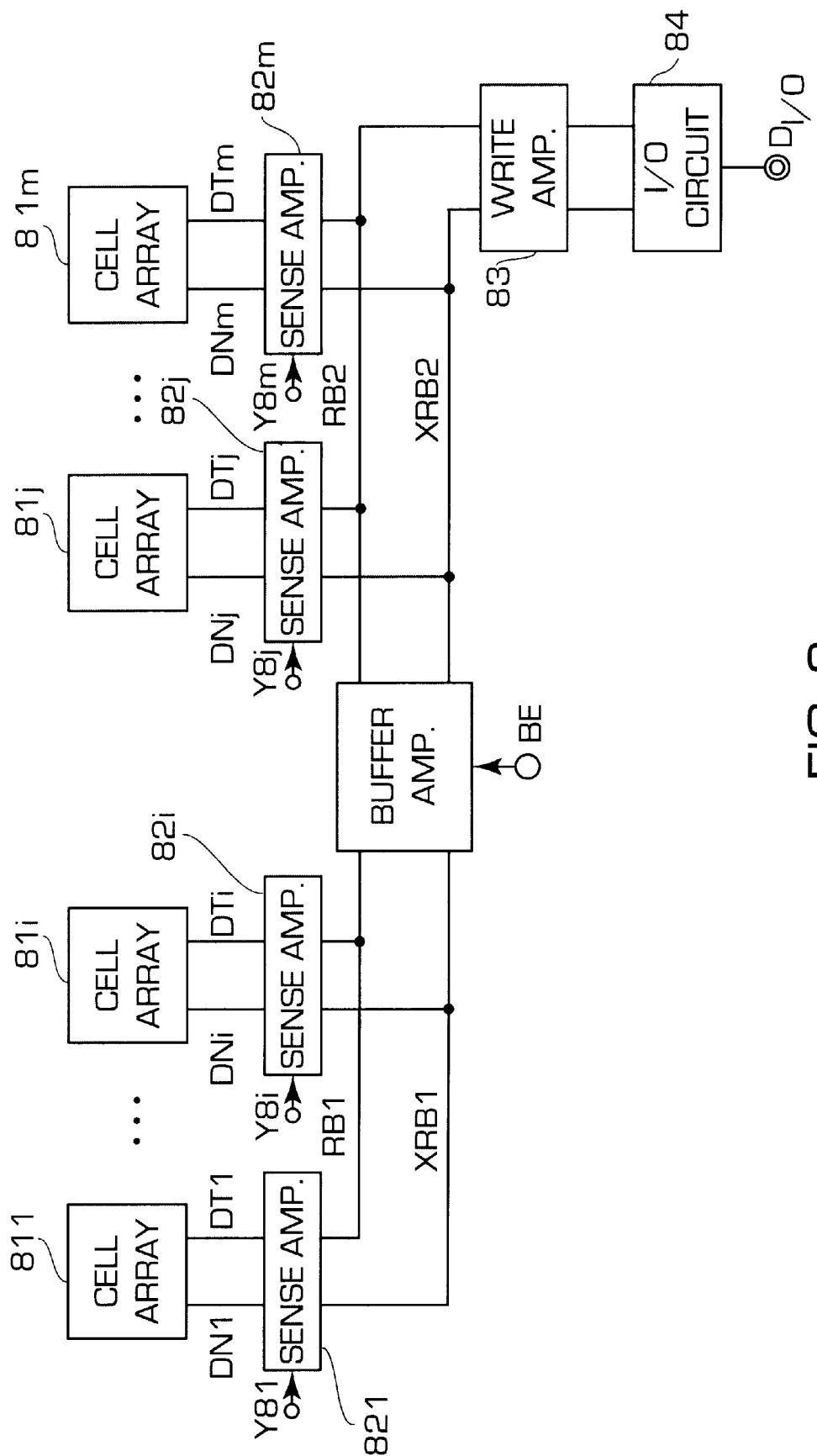
FIG. 6 is a block diagram showing another conventional semiconductor memory device.
Figure 7:
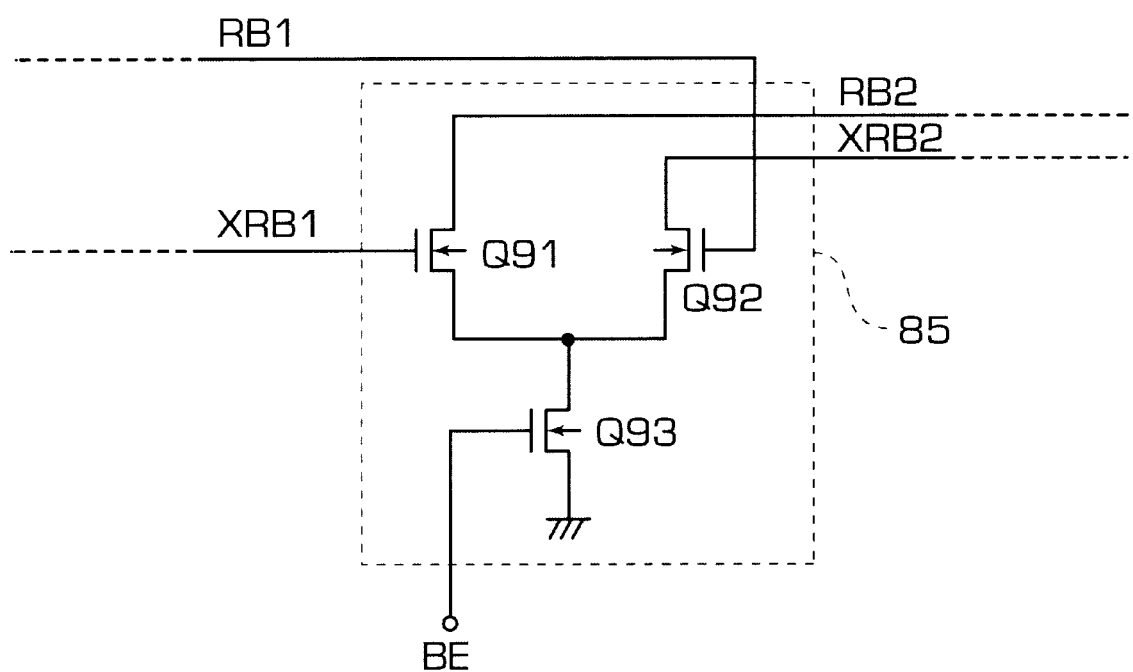
FIG. 7 is a circuit diagram showing a buffer amplifier 85 in FIG. 6.
Figure 14:
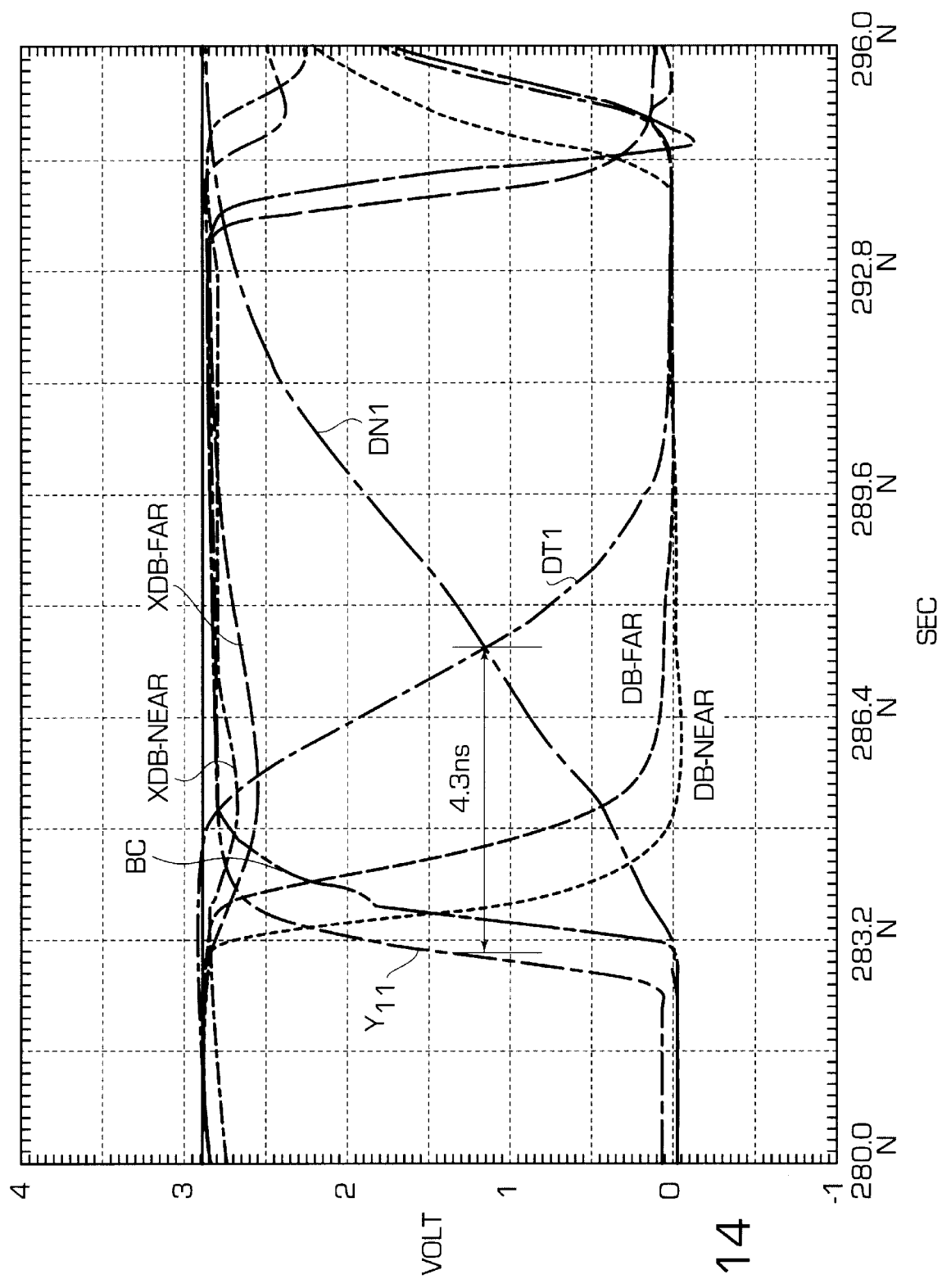
FIG. 14 is a diagram showing simulation results at the time of writing shown in FIG. 8.

Simulation results at the time of writing according to the present embodiment is shown in FIG. 14. The simulation results are obtained, similarly to the simulation operation of the conventional semiconductor memory device shown in FIG. 5, when the reverse data is written in the cell array, in which the data DT1 is at the high level and the data DN1 is at the low level, to put the data DT1 into the low level and the data DN1 into the high level. In the case of the simulation according to the present embodiment, however, due to the provision of the sub-amplifier 16, the sub-amplifier enable signal line BC is changed from the low level to the high level with such a timing that NMOS transistor Q23 is turned on upon the start of data output from the data amplifier 14 shown in FIG. 8.

As known from the simulation results, according to the present embodiment, it takes the time period of 4.3 ns to cross the data DT1 and data DN1 after the sense amplifier selection signal Y11 reaches the high level. Therefore, when comparing the time period required for writing the data on the bus lines DB and XDB into the targeted sense amplifier from the write amplifier 13, between the simulation results of the present embodiment and the simulation results of the prior art shown in FIG. 5, it is found that the present embodiment is faster in writing than the conventional semiconductor memory device shown in FIG. 1 by 1.1 (=5.4–4.3) ns. In FIG. 14, DB-near and XDB-near denote signals output from the data amplifier 14 to the bus lines DB and XDB, and DB-far and XDB-far denote signals supplied from the bus lines DB and XDB to the sense amplifier 121.

Figure 10:
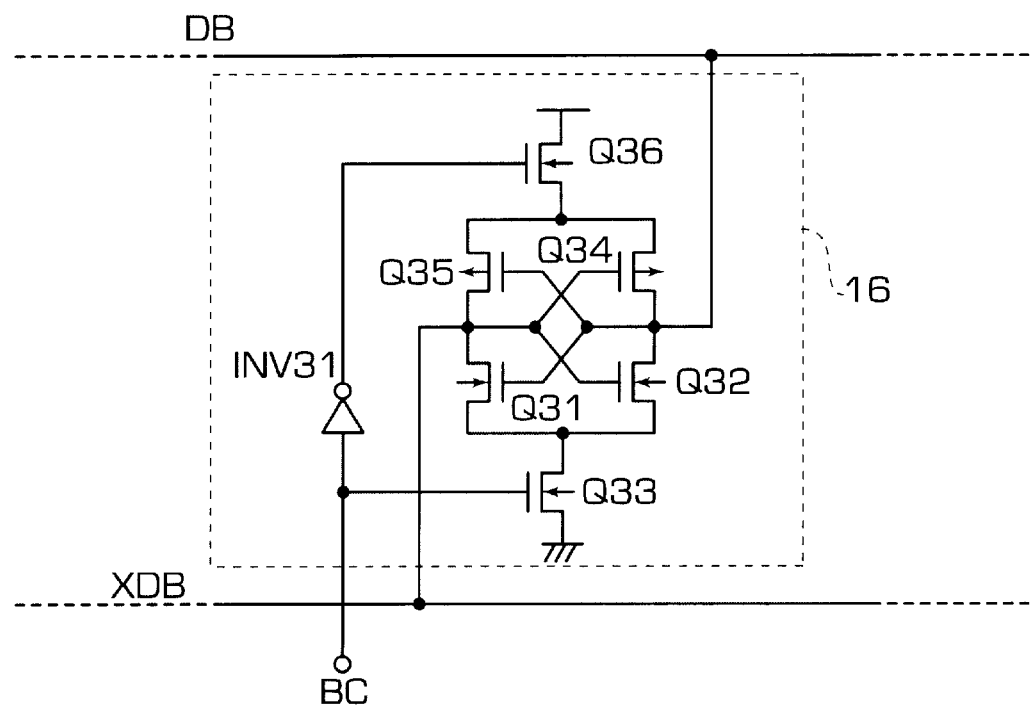
FIG. 10 is a circuit diagram showing another example of a sub-amplifier 16 in FIG. 8.

Next, another example of the sub-amplifier 16 will be described. FIG. 10 is a circuit diagram of another example of the sub-amplifier 16 shown in FIG. 8. The sub-amplifier 16 is composed of a NMOS transistor Q33 a gate of which is connected with the sub-amplifier enable signal line BC, an inverter INV 31 connected with the sub-amplifier enable line BC, a PMOS transistor Q36 wherein the output of the inverter INV31 is to be applied at the gate thereof, NMOS transistors Q31 and Q32 which are activated upon receipt of a change in the data level of the bus lines DB and XDB, and PMOS transistors Q34 and Q35. The transistors Q31 and Q35 are connected with each other at the gates and the drains, respectively. Transistors Q32 and Q34 are also connected with each other at the gates and the drains, respectively. The source of the transistor Q36 is connected With the power-supply terminal on the higher potential side, while its drain is connected in common with the sources of the transistors Q34 and Q35. The source of the transistor Q33 is connected with the power-supply terminal on the lower potential side, and the drain is connected in common with the source of the transistors Q31 and Q32.

The constitution of the above-described sub-amplifier 16 is different from the one shown in FIG. 9 in the point that it comprises a PMOS differential amplifier composed of the transistors Q34 and Q35 in addition to an NMOS differential amplifier composed of the transistors Q31 and Q32. This constitution makes the invention useful in the case where the pre-charge level of the bus lines DB and XDB are VCC/2. The operation of the differential amplifier is the same as that of the sub-amplifier 16 shown in FIG. 9.

The present invention should not be restricted to the above-described embodiments, and a plurality of sub-amplifiers may be provided between the bus lines.

While preferred embodiments of the present invention have been described using specific terms, such description is for illustrative purposes only, and it is to be understood that changes and variations may be made without departing from the spirit or scope of the following claims.

What is claimed is:

1. A semiconductor memory device comprising:
   a plurality of memory cell arrays;
   a plurality of sense amplifiers, each being arranged for corresponding to one of said memory cell arrays via a respective pair of a plurality of pairs of data lines, and for amplifying read-out data from the corresponding one of said cell arrays and for amplifying data to be written to the corresponding cell array;
   first and second bus lines, which are distinguished from said plurality of pairs of data lines connected to said sense amplifiers, said bus lines transmitting the read-out data from said cell arrays via the data lines as a potential difference and transmitting the data to be written to said cell arrays as a potential difference; and
   at least one sub-amplifier connected between said first and second bus lines, said sub-amplifier amplifying the potential difference of the read-out data which is output on said first and second bus lines from a selected one of said sense amplifiers and amplifying the potential difference of the data to be written to said cell arrays which is input to said first and second bus lines from an external portion.

2. The semiconductor memory device according to claim 1, wherein said sub-amplifier includes a first transistor, a gate of which is directly connected to the first bus line, and a drain of which is directly connected to the the second bus line; a second transistor of the same conductivity type as that of said first transistor; a gate of which is directly connected to the second bus line, and a drain of which is directly connected to the first bus line; and a third transistor of the same conductivity type as those of said first and second transistors, a drain of which is in common connected to sources of said first and second transistors, and a gate of which is supplied with an enable signal so that said third transistor is controlled.

3. The semiconductor memory device according to claim 1, wherein said sub-amplifier includes a first transistor, a gate of which is connected with the first bus line and a drain of which is connected with the second line; a second transistor of the same conductivity type as that of the first transistor, a gate of which is connected with the second bus line, and drain of which is connected with the first bus line; a third transistor of the same conductivity type as those of the first and second transistors, a drain of which is connected in common with the sources of the first and second transistors, and the source of which is connected with a power-supply terminal on the lower potential side, the third transistor being controlled by receiving an enable signal through the gate thereof; an inverter for inverting the enable signal; a fourth transistor of a different conductivity type from that of the first transistor, gate and drain of which are connected with the gate and drain of the first transistor respectively; a fifth transistor of the same conductivity type as that of the fourth transistor; a gate and drain of which are connected with the gate and drain of the second transistor respectively; and sixth transistor of the same conductivity type as those of the fourth and fifth transistor, source of which is connected in common with the sources of the fourth and fifth transistors, and drain of which is connected with the power-supply terminal on the higher potential side, the sixth transistor being controlled by receiving the output signal of the inverter through the gate.

4. The semiconductor memory device of claim 3, wherein the gate of the first transistor is directly connected with the first bus line, and the drain of the first transistor is directly connected to the second bus line, and wherein the gate of the second transistor is directly connected to the second bus line and the drain of the second transistor is directly connected to the first bus line.

* * * * *